(12) United States Patent
Yamamoto et al.

(10) Patent No.: US 11,108,178 B2
(45) Date of Patent: Aug. 31, 2021

(54) ELECTRONIC DEVICE WITH HOUSING STORING ELECTRONIC COMPONENT

(71) Applicants: Kabushiki Kaisha Toshiba, Tokyo (JP); Toshiba Electronic Devices & Storage Corporation, Tokyo (JP)

(72) Inventors: Nobuhiro Yamamoto, Yokohama Kanagawa (JP); Kiyokazu Ishizaki, Inagi Tokyo (JP); Kota Tokuda, Kawasaki Kanagawa (JP); Yousuke Hisakuni, Sagamihara Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/298,268

(22) Filed: Mar. 11, 2019

(65) Prior Publication Data

US 2020/0091641 A1  Mar. 19, 2020

(30) Foreign Application Priority Data

Sep. 19, 2018  (JP) .............................. JP2018-174649

(51) Int. Cl.

| | |
|---|---|
| *H01R 12/78* | (2011.01) |
| *G11B 33/14* | (2006.01) |
| *H01R 12/79* | (2011.01) |
| *H01R 13/24* | (2006.01) |

(Continued)

(52) U.S. Cl.
CPC ............. *H01R 12/78* (2013.01); *G11B 33/14* (2013.01); *H01R 12/79* (2013.01); *H01R 13/24* (2013.01); *H05K 1/118* (2013.01); *H01R 12/707* (2013.01); *H05K 2201/056* (2013.01)

(58) Field of Classification Search
CPC ... G11B 25/043; G11B 33/122; G11B 33/126; G11B 33/14; H01R 12/78; H01R 12/79; H01R 13/24; H01R 12/707; H05K 1/118; H05K 2201/056

See application file for complete search history.

(56) References Cited

U.S. PATENT DOCUMENTS 5,508,860 A * 4/1996 Takagi ................. G11B 5/5521
                                                      360/99.16
6,057,982 A * 5/2000 Kloeppel ............. G11B 25/043
                                                      360/99.25

(Continued)

FOREIGN PATENT DOCUMENTS

| CN | 103890686 A | 6/2014 |
|---|---|---|
| JP | S62-91451 U | 6/1987 |

(Continued)

*Primary Examiner* — Brian E Miller
(74) *Attorney, Agent, or Firm* — White & Case LLP

(57) ABSTRACT

According to one embodiment, an electronic device includes a housing with a through-hole, a flexible printed circuit inserted through the through hole and including a first connection portion on an inner side of the housing with first connection pads and a second connection portion on an outer side of the housing with second connection pads, a first electrical component in the housing, and a first connector connected to the first electrical component and including connection terminals contacting the first connection pads. A first pad of the first connection pads is greater than other first connection pads.

16 Claims, 11 Drawing Sheets

(51) Int. Cl.
*H05K 1/11* (2006.01)
*H01R 12/70* (2011.01)

(56) References Cited

U.S. PATENT DOCUMENTS

| | | | | |
|---|---|---|---|---|
| 6,129,579 | A * | 10/2000 | Cox | G11B 5/4846 439/493 |
| 6,168,459 | B1 * | 1/2001 | Cox | G11B 5/4846 439/495 |
| 6,970,322 | B2 * | 11/2005 | Bernett | G11B 25/043 360/245.9 |
| 7,599,147 | B2 * | 10/2009 | Gunderson | H05K 5/069 360/97.22 |
| 8,098,454 | B2 * | 1/2012 | Kouno | G11B 33/1466 360/99.21 |
| 8,587,901 | B1 * | 11/2013 | Puttichaem | G11B 5/4826 360/234.5 |
| 9,472,242 | B1 | 10/2016 | Le et al. | |
| 9,490,620 | B1 * | 11/2016 | Albrecht | G11B 33/14 |
| 9,570,114 | B1 * | 2/2017 | Sudo | G11B 33/1486 |
| 9,672,870 | B1 * | 6/2017 | Mizumoto | G11B 25/043 |
| 10,424,345 | B1 * | 9/2019 | Namihisa | G11B 25/043 |
| 10,594,100 | B1 * | 3/2020 | Namihisa | G11B 33/122 |
| 2004/0257698 | A1 * | 12/2004 | Bernett | G11B 33/122 360/99.18 |
| 2006/0050429 | A1 * | 3/2006 | Gunderson | G11B 25/043 360/99.21 |
| 2007/0032833 | A1 * | 2/2007 | Gunderson | H05K 5/069 607/37 |
| 2007/0274005 | A1 * | 11/2007 | Zhu | G11B 5/102 360/234.4 |
| 2008/0144273 | A1 * | 6/2008 | Mewes | G11B 33/121 361/679.37 |
| 2009/0168233 | A1 * | 7/2009 | Kouno | G11B 33/1466 360/99.21 |
| 2011/0139493 | A1 | 6/2011 | Sumida et al. | |
| 2011/0211279 | A1 * | 9/2011 | Jacoby | G11B 33/122 360/99.21 |
| 2012/0137751 | A1 * | 6/2012 | Brown | G01M 3/229 73/40.7 |
| 2013/0063839 | A1 * | 3/2013 | Matsumoto | G11B 5/4826 360/99.08 |
| 2014/0269240 | A1 | 9/2014 | Phelan et al. | |
| 2015/0257293 | A1 * | 9/2015 | Hirano | H05K 5/069 361/679.33 |
| 2015/0359115 | A1 * | 12/2015 | Hirano | G11B 33/128 361/679.34 |
| 2017/0169860 | A1 * | 6/2017 | Sudo | G11B 25/043 |
| 2017/0169861 | A1 * | 6/2017 | Sudo | G11B 25/043 |
| 2017/0221527 | A1 * | 8/2017 | Choe | B29C 65/48 |
| 2017/0294737 | A1 * | 10/2017 | Horchler | H01R 13/5202 |
| 2017/0352386 | A1 * | 12/2017 | Kaneko | H05K 5/0247 |
| 2018/0337477 | A1 | 11/2018 | Yamamoto et al. | |
| 2019/0074615 | A1 * | 3/2019 | Okamoto | G11B 33/00 |
| 2019/0333532 | A1 * | 10/2019 | Wessel | G11B 5/3169 |
| 2019/0378545 | A1 * | 12/2019 | Sudo | G11B 25/043 |

FOREIGN PATENT DOCUMENTS

| | | |
|---|---|---|
| JP | S63-018854 U1 | 2/1988 |
| JP | H04-184968 A | 7/1992 |
| JP | 2018-195367 A | 12/2018 |
| WO | 2010/018759 A1 | 2/2010 |

\* cited by examiner

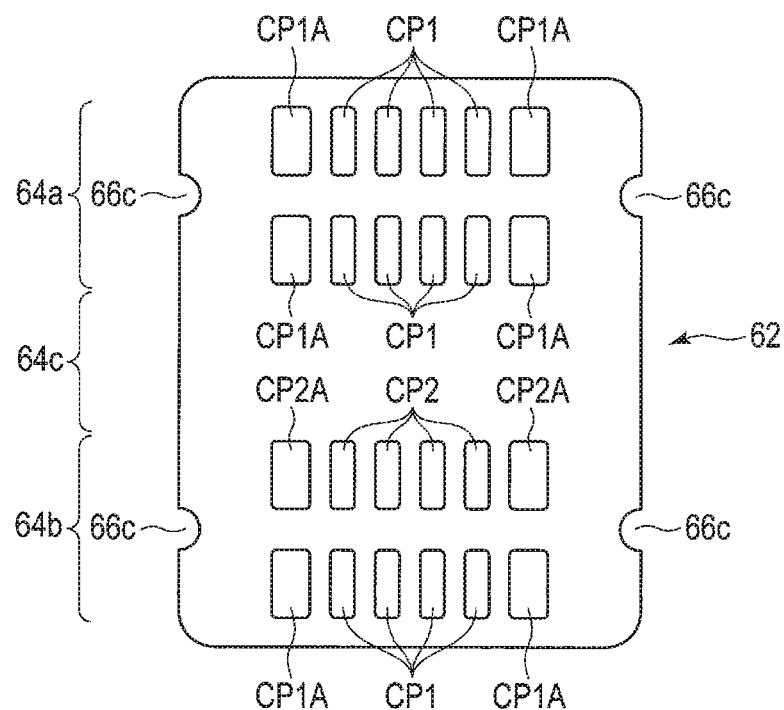
F I G. 10
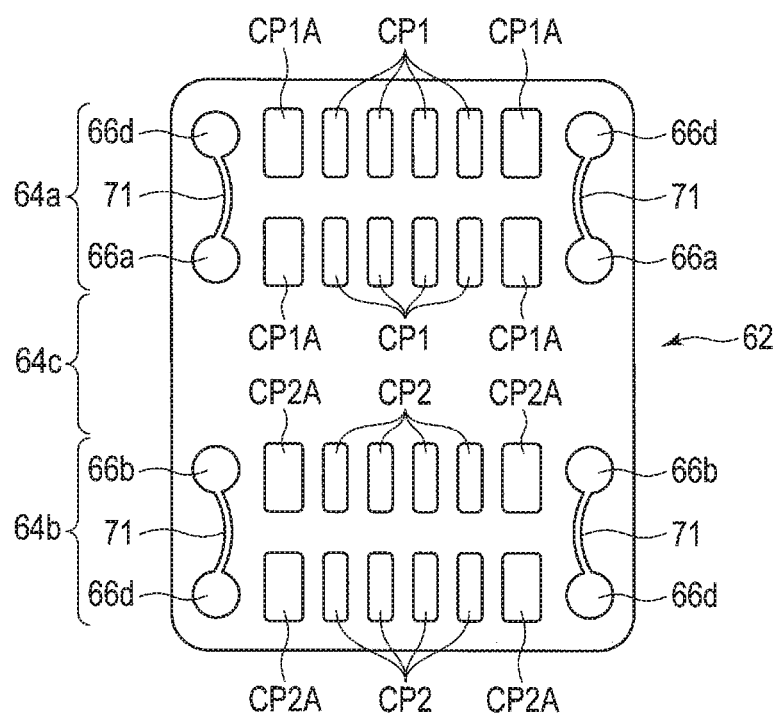
F I G. 11

ELECTRONIC DEVICE WITH HOUSING STORING ELECTRONIC COMPONENT

CROSS-REFERENCE TO RELATED APPLICATIONS

This application is based upon and claims the benefit of priority from Japanese Patent Application No. 2018-174649, filed Sep. 19, 2018, the entire contents of which are incorporated herein by reference.

FIELD

Embodiments described herein relate generally to an electronic device.

BACKGROUND

In general, electronic devices comprise a housing and a plurality of electrical components disposed in the housing. The electrical components are electrically connected to other electrical components provided outside the housing via connection mechanisms such as connectors or wiring boards.

BRIEF DESCRIPTION OF THE DRAWINGS

FIG. 10 is a development view of the flexible printed circuit according to a first modified example.

FIG. 11 is a development view of the flexible printed circuit according to a second modified example.

DETAILED DESCRIPTION

Figure 1:
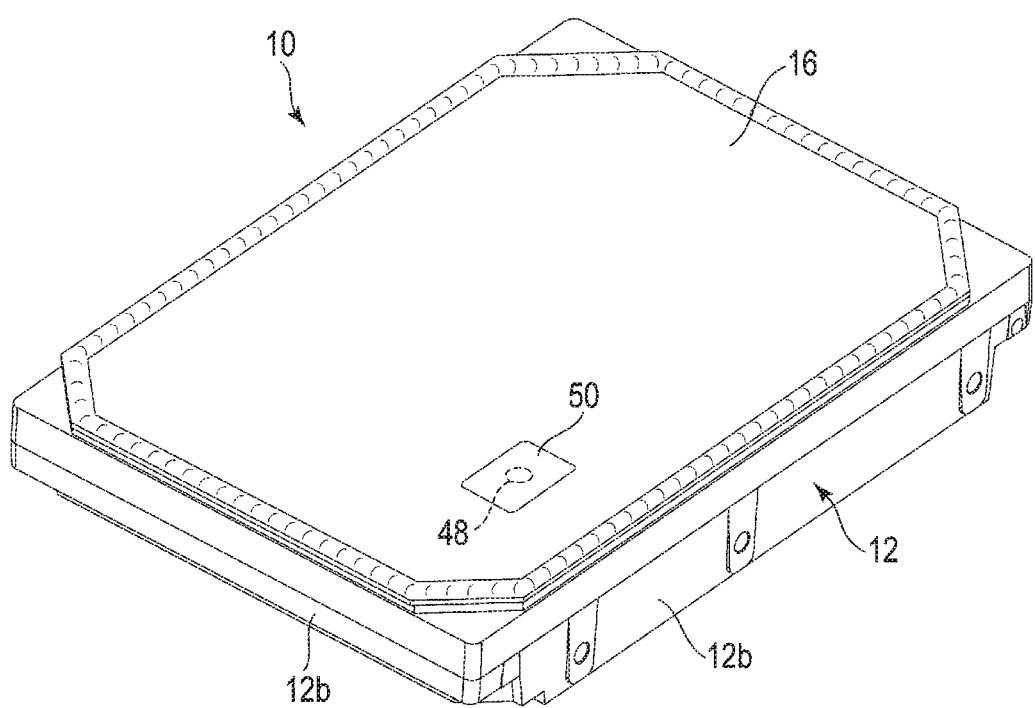
FIG. 1 is a perspective view showing an external appearance of a hard disk drive (HDD) according to a first embodiment.

Various embodiments will be described hereinafter with reference to the accompanying drawings. In general, according to one embodiment, an electronic device comprises: a housing comprising a through-hole; a flexible printed circuit comprising a first connection portion provided with a plurality of first connection pads and a second connection portion provided with a plurality of second connection pads, wherein the flexible printed circuit is inserted in the through-hole, the first connection portion is disposed on an inner side of the housing, and the second connection portion is disposed on an outer side of the housing; a first electrical component in the housing; and a first connector in the housing connected to the first electrical component, the first connector comprising a plurality of connection terminals which contact the first connection pads, respectively, wherein a first pad of the first connection pads is greater than other first connection pads.

The disclosure is merely an example, and proper changes in keeping with the spirit of the invention, which are easily conceivable by a person with ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, the same elements as those described in connection with preceding drawings are denoted by like reference numbers, and detailed description thereof is omitted unless necessary.

First Embodiment

A hard disk drive (HDD) according to an embodiment will be described in detail as an example of an electronic device.

Figure 2:
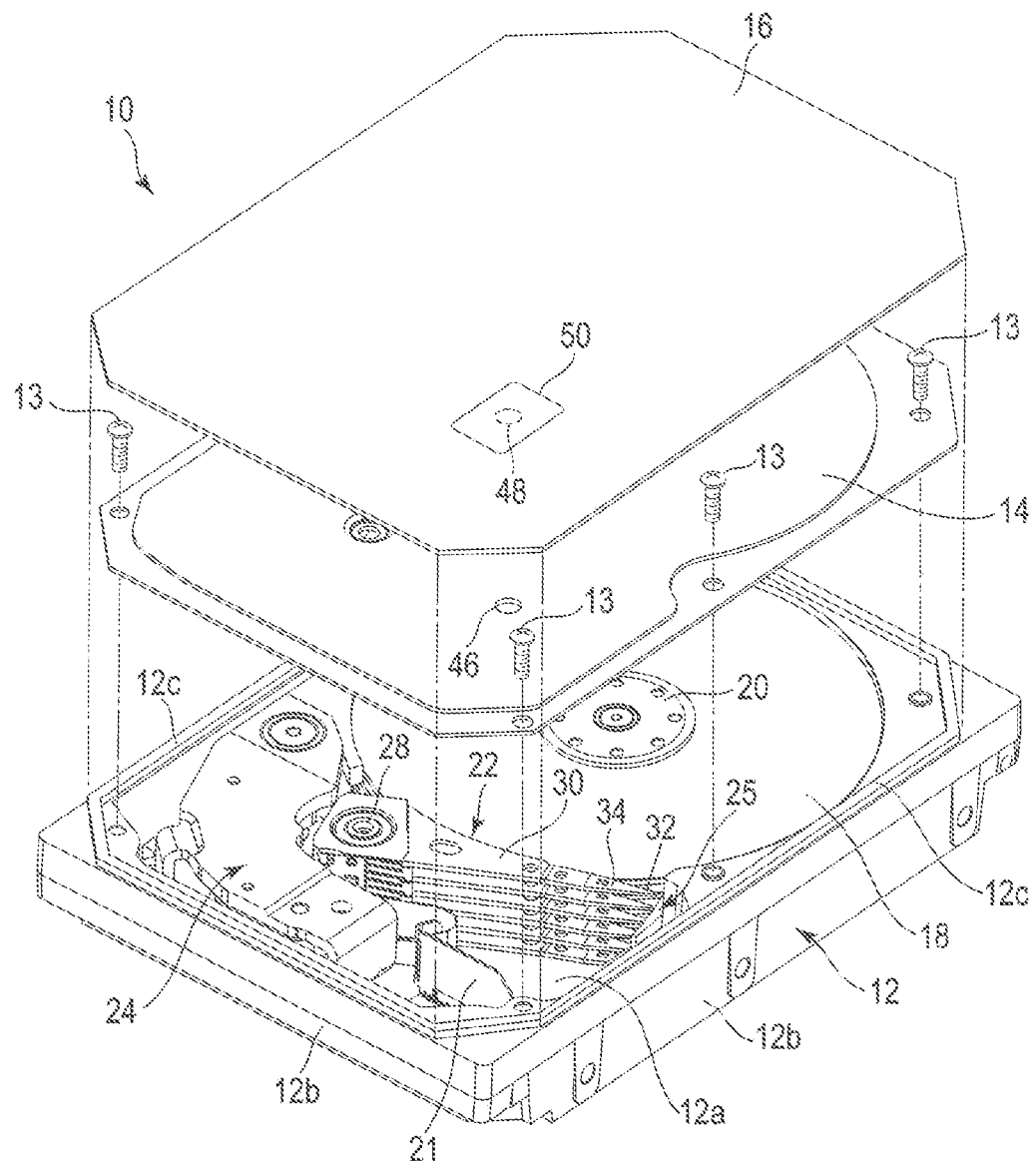
FIG. 2 is an exploded perspective view of the HDD according to the first embodiment.

FIG. 1 is a perspective view showing an external appearance of the HDD according to a first embodiment. FIG. 2 is an exploded perspective view showing an internal structure of the HDD.

As shown in FIG. 1 and FIG. 2, the HDD comprises a housing 10 which is flat and substantially in the shape of a rectangular parallelepiped. The housing 10 comprises a rectangular box-shaped base 12 having an opened top surface, an inner cover 14 screwed to the base 12 with screws 13 to close the top opening of the base 12, and an outer cover (top cover) 16 overlaid on the inner cover 14 and including a peripheral portion welded to the base 12. The base 12 comprises a rectangular bottom wall 12a which faces the inner cover 14 with a gap therebetween, and sidewalls 12b which stand along a periphery of the bottom wall 12a. The bottom wall 12a and the sidewalls 12b are integrally formed of, for example, an aluminum alloy. The sidewalls 12b include a pair of long side walls facing each other, and a pair of short side walls facing each other. A substantially rectangular frame-shaped fixing rib 12c is provided on top surfaces of the sidewalls 12b.

The inner cover 14 is, for example, formed of stainless steel into the form of a rectangular plate. The inner cover 14 is fixed in the inside of the fixing rib 12c with its peripheral portion screwed on the upper surfaces of the sidewalls 12b of the base 12 with the screws 13. The outer cover 16 is, for example, formed of aluminum into the form of a rectangular plate. The outer cover 16 is formed to have planar dimensions slightly greater than those of the inner cover 14. The whole peripheral portion of the outer cover 16 is welded to the fixing rib 12c of the base 12 and fixed thereto in an airtight manner.

Vents 46 and 48 to communicate the outside and inside of the housing 10 with each other are formed in the inner cover 14 and the outer cover 16, respectively. The air in the housing 10 is discharged through the vents 46 and 48 and then a low-density gas (inert gas) having a density lower than that of air, for example, helium is introduced through the vents 46 and 48 and enclosed or sealed in the housing 10. For example, a seal (sealing member) 50 is stuck on the outer surface of the outer cover 16 so as to close the vent 48.

As shown in FIG. 2, in the housing 10, a plurality of magnetic disks 18 as recording media, for example, five to nine magnetic disks 18, and a spindle motor 20 as a driving portion which supports and rotates the magnetic disks 18 are provided. The spindle motor 20 is disposed on the bottom wall 12a. Each of the magnetic disks 18 is, for example, formed to have a diameter of 95 mm (3.5 inches), and comprises a magnetic recording layer in their upper surfaces and/or lower surfaces. The magnetic disks 18 are fitted to a hub of the spindle motor 20, which is not shown in the figures, coaxially with each other, and are clamped by a clamp spring and fixed to the hub. Each of the magnetic disks 18 is thereby supported in a state in which each of the magnetic disks 18 is located parallel to the bottom wall 12a of the base 12. The magnetic disks 18 are rotated at a predetermined rate of rotation by the spindle motor 20.

In the present embodiment, the five to nine magnetic disks 18 are accommodated in the housing 10. However, the number of magnetic disks 18 is not limited to this. In addition, a single magnetic disk 18 may be accommodated in the housing 10.

In the housing 10, a plurality of magnetic heads 32 which record and reproduce information on and from the magnetic disks 18, and a head stack assembly (actuator) 22 which supports the magnetic heads 32, such that the magnetic heads 32 are movable with respect to the magnetic disks 18, are provided. The head stack assembly 22 comprises a rotatable bearing unit 28, a plurality of arms 30 extending from the bearing unit 28, and a plurality of suspensions 34 extending from the arms 30, respectively. The magnetic heads 32 are supported on the distal ends of the suspensions 34, respectively.

Further, in the housing 10 are provided a voice coil motor (hereinafter referred to as a VCM) 24 which rotates and positions the head stack assembly 22, a ramp load mechanism 25 which holds the magnetic heads 32 at an unloading position that is away from the magnetic disks 18 when the magnetic heads 32 are moved to the outermost circumferences of the magnetic disks 18, and a board unit (first electrical component) 21 on which electronic components including a conversion connector (first connector) 70a are mounted. The board unit 21 is formed of a flexible printed circuit (FPC). The FPC is electrically connected to a voice coil of the VCM 24 and the magnetic heads 32 via a relay FPC on the head stack assembly 22.

Figure 3:
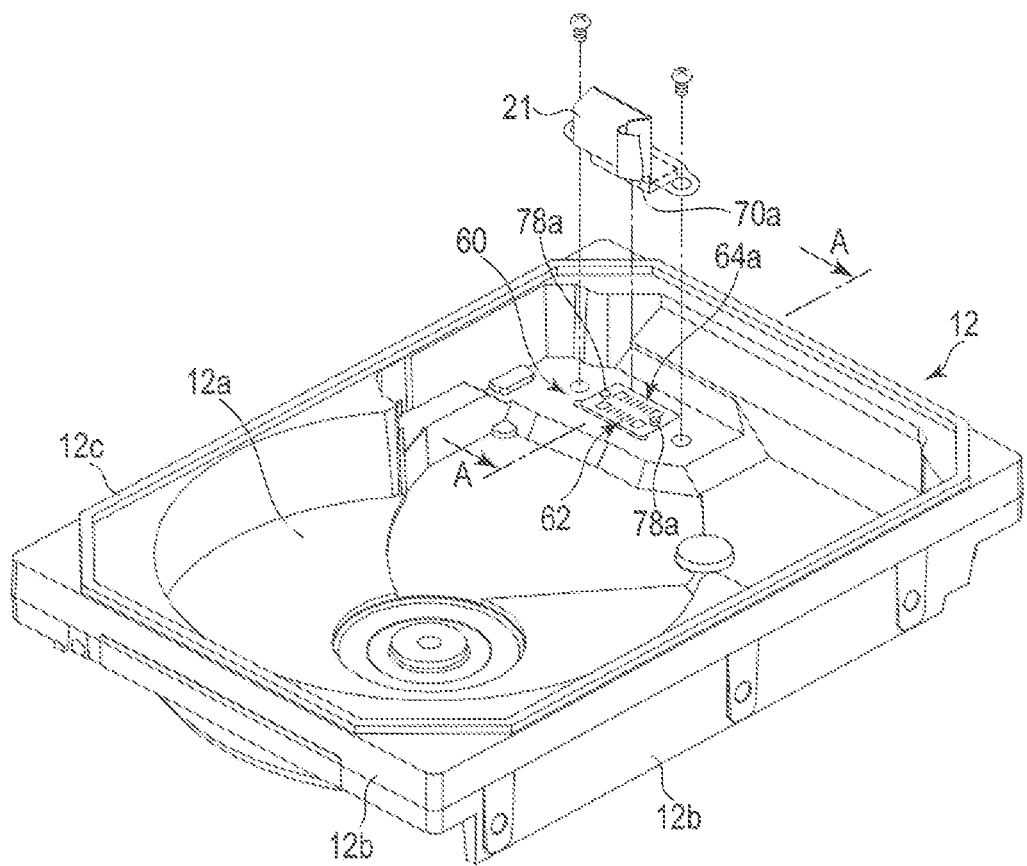
FIG. 3 is a perspective view showing a base of a housing of the HDD.
Figure 4:
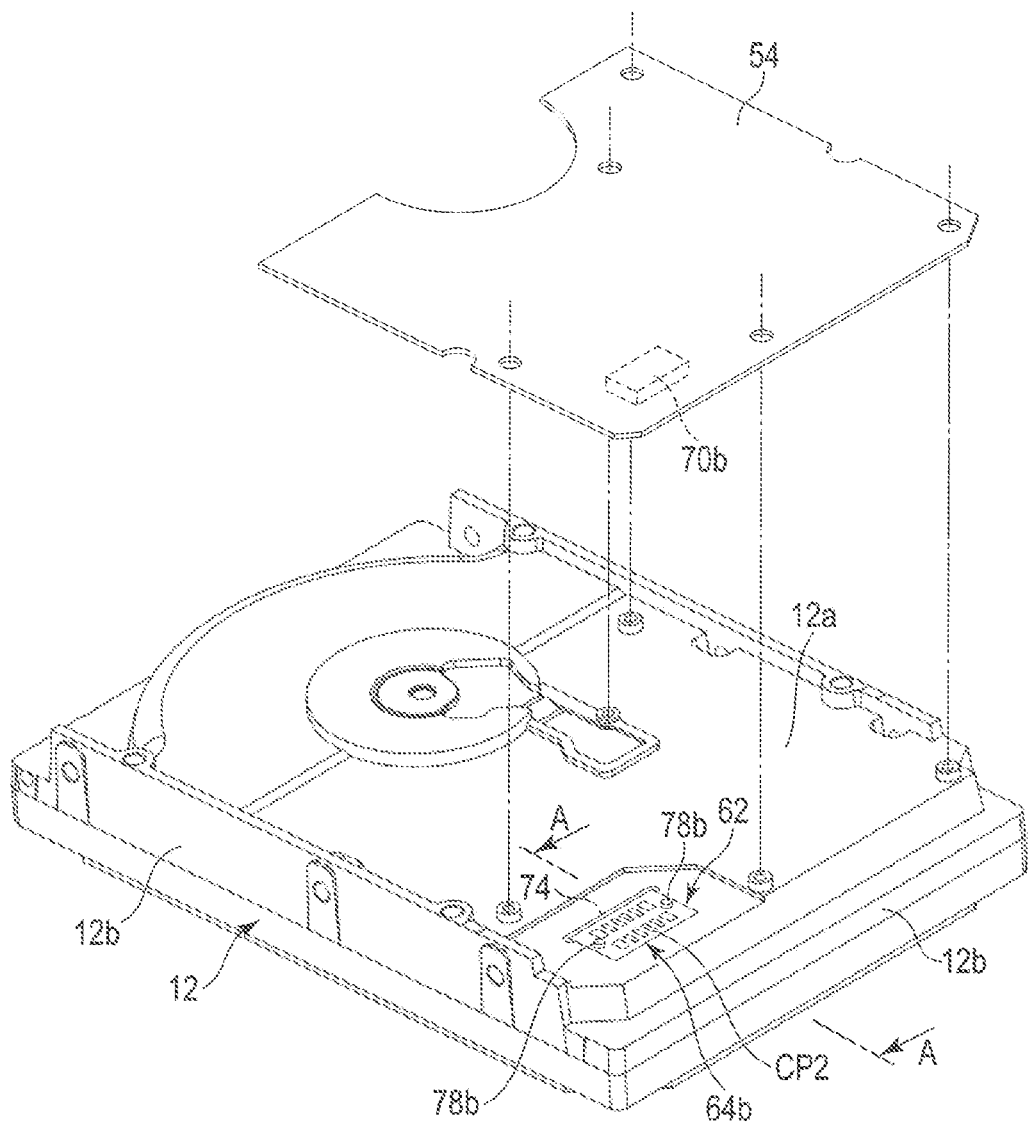
FIG. 4 is an exploded perspective view showing a back surface side of the base and a control circuit board.

FIG. 3 is a perspective view of the base of the housing in a state in which most of the constituent elements are removed. FIG. 4 is a perspective view showing a rear surface side of the housing and a control circuit board.

As shown in FIG. 4, for example, a control circuit board 54 as a second electrical component is opposed to an outer surface of the bottom wall 12a of the base 12. The control circuit board 54 is screwed on the bottom wall 12a. Electronic components, such as an IC, a coil, a capacitor, and a resistor, which are not shown in the figures, are mounted on the control circuit board 54. These electronic components and lines provided on the control circuit board 54 constitute a controller which controls the operation of the HDD 10 and arithmetic processing. The controller controls the operation of the spindle motor 20, and controls the operation of the VCM 24 and the magnetic heads 32 via the board unit 21. A second connector 70b is mounted on an inner surface, that is, a surface facing the bottom wall 12a, of the control circuit board 54, and is electrically connected to the control circuit board 54.

As shown in FIG. 3 and FIG. 4, the HDD comprises a connection mechanism 60 which electrically connects the first electrical component (board unit 21) disposed inside the housing 10 and the second electrical component (control circuit board 54) disposed outside the housing 10. The connection mechanism 60 includes a flexible printed circuit (FPC) 62 provided on the bottom wall 12a, the first connector 70a electrically connected to the board unit 21, and the second connector 70b connected to the control circuit board 54. The board unit 21 is electrically connected to the control circuit board 54 via the first connector 70a, the FPC 62, and the second connector 70b.

Figure 5:
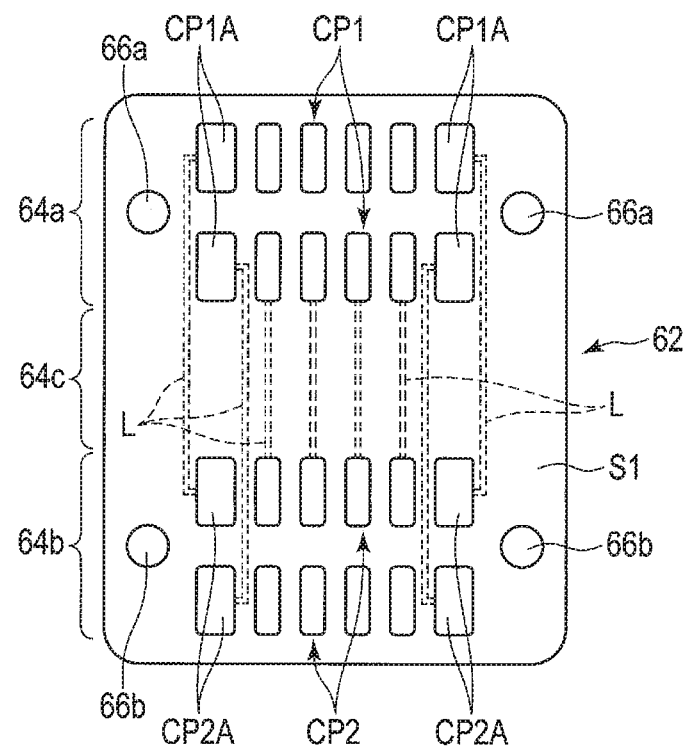
FIG. 5 is a development view of a flexible printed circuit constituting a connection structure portion.
Figure 6:
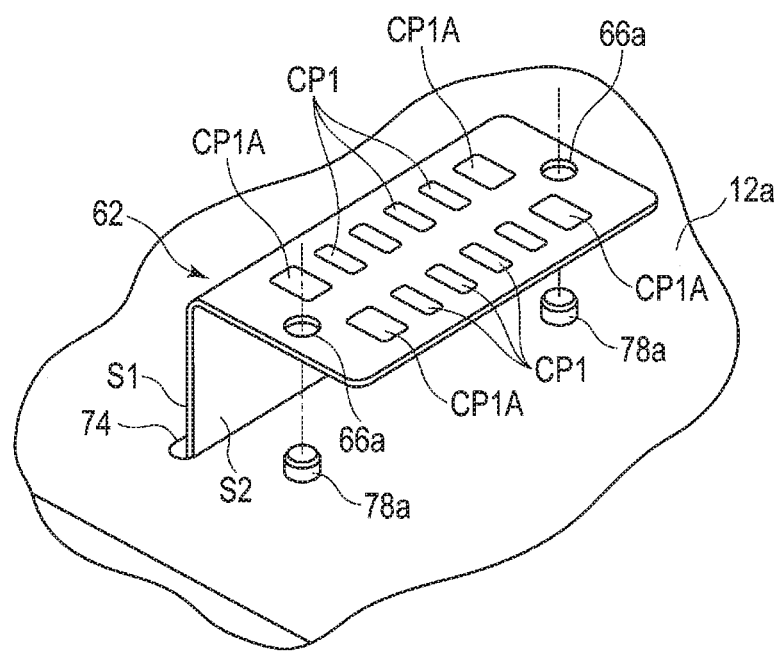
FIG. 6 is a perspective view showing the flexible printed circuit and a part of the housing.
Figure 7:
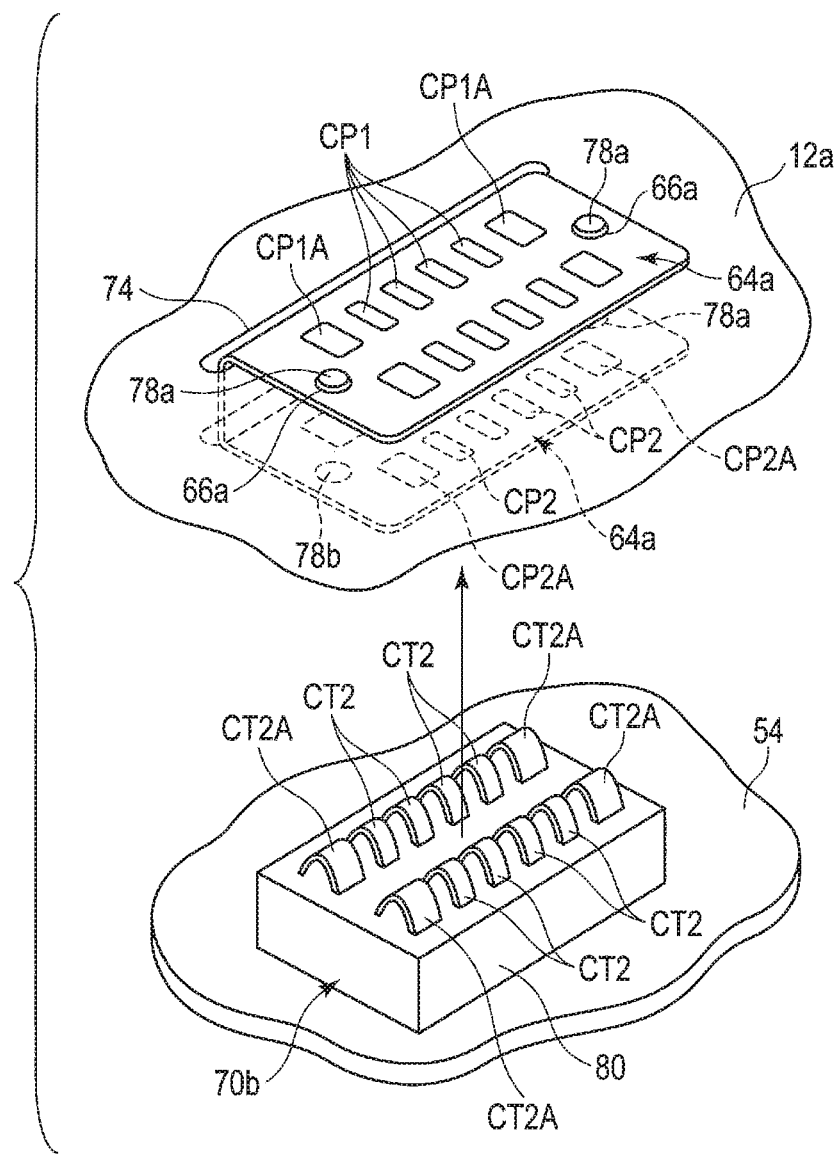
FIG. 7 is a perspective view showing the flexible printed circuit and a connecter disposed in the housing.
Figure 8:
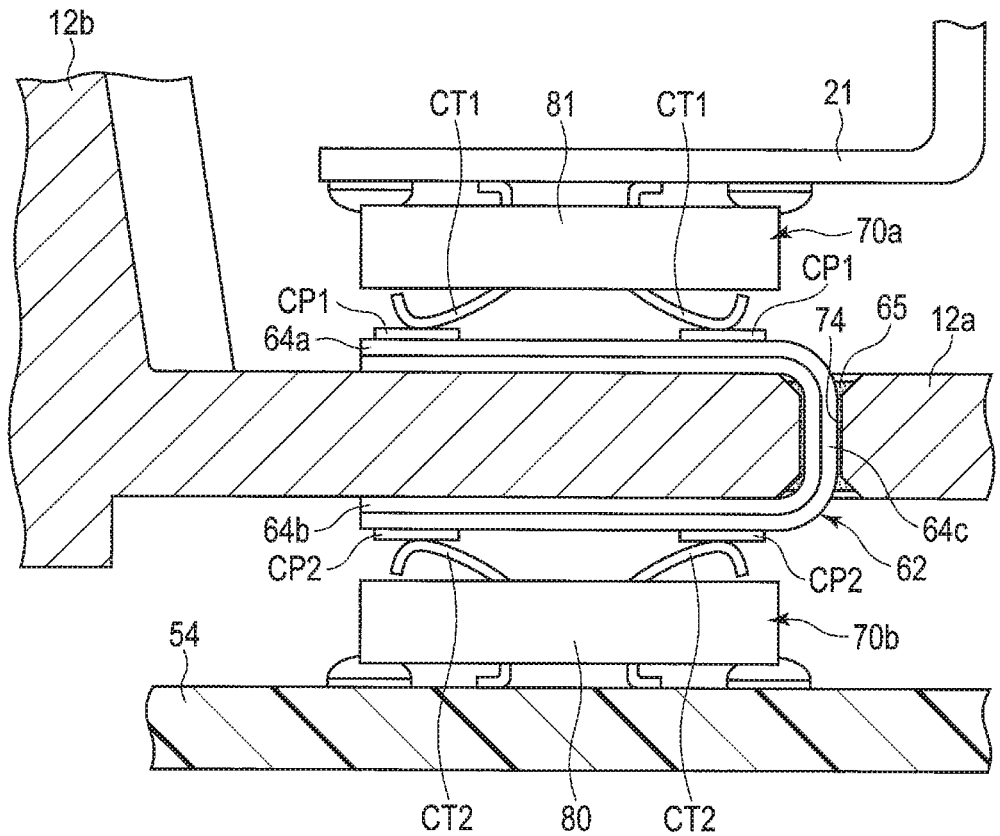
FIG. 8 is a sectional view of the housing and the connection structure portion along line A-A of FIG. 3.

FIG. 5 is a development view of the flexible printed circuit constituting the connection mechanism. FIG. 6 is a perspective view showing the flexible printed circuit and a part of the housing. FIG. 7 is a perspective view showing the flexible printed circuit and a connector disposed in the housing. FIG. 8 is a sectional view of the housing and the connection mechanism taken along line A-A of FIG. 3.

As shown in FIG. 5, the FPC 62 is formed into the form of a thin flat band and into the form of a film. The FPC 62 comprises a base insulating layer formed of an insulating synthetic resin, for example, polyimide, a conductive layer laid on the base insulating layer, and a cover insulating layer laid on the base insulating layer and the conductive layer. The conductive layer is formed of a conductive metallic material, for example, a copper material, and is patterned to form a plurality of lines L and a plurality of connection pads CP1 and CP2. The cover insulating layer is formed of an insulating synthetic resin, for example, polyimide, and covers the conductive layer and the base insulating layer except for the connection pads CP1 and CP2. The connection pads CP1 and CP2 are exposed at a first surface S1 of the FPC 62. In the present embodiment, the first surface S1 of the FPC 62 is a surface formed by the cover insulating layer, and a second surface S2 on the opposite side is a surface formed by the base insulating layer.

The FPC 62 comprises a first connection portion 64a formed at one end portion in a longitudinal direction, a second connection portion 64b formed at the other end portion in the longitudinal direction, and a relay portion 64c located between the first connection portion 64a and the second connection portion 64b. The first connection portion 64a is formed into a rectangular shape. The first connection portion 64a is provided with a plurality of first connection pads CP1. The first connection pads CP1 are, for example, arranged in two lines. Each of the first connection pads CP1 is, for example, formed into a rectangular shape. Each of the lines extends in a direction orthogonal to the longitudinal direction of the FPC 62, for example, in a width direction. In each of the lines, a plurality of first connection pads CP1, for example, six first connection pads CP1, are arranged with a gap therebetween. In addition, the two lines extend parallel to each other with a gap therebetween.

At least one first connection pad (first pad) of the first connection pads CP1 has dimensions and a contact area which are greater than those of the other first connection pads. For example, the at least one first connection pad is formed to have a width greater than the width of the other first connection pads. According to the present embodiment, two first connection pads CP1A which are located at one end and the other end of each of the lines are formed to have a width (for example, 1.2 to 2 times) greater than the width of the other first connection pads CP1 in the same line. The other first connection pads CP1 are formed to have the same dimensions. Also, the first connection pads CP1A may have a width equal to that of the other first connection pads CP1 and have a length greater than that of the other connection pads CP1. Alternatively, the first connection pads CP1A may have a width and a length which are greater than those of the other first connection pads CP1.

The first connection portion 64a comprises one or more positioning holes 66a as engagement portions for positioning. In the present embodiment, the first connection portion 64a comprises two positioning holes 66a formed at both end portions in a width direction.

The second connection portion 64b is formed into a rectangular shape. The second connection portion 64b is provided with a plurality of second connection pads CP2. Each of the second connection pads CP2 is, for example, formed into a rectangular shape. The second connection pads CP2 are, for example, arranged in two lines. Each of the lines extends in the width direction of the FPC 62. In each of the lines, a plurality of second connection pads, for example, six second connection pads, are arranged with a gap therebetween. In addition, the two lines extend parallel to each other with a gap therebetween.

At least one second connection pad (second pad) of the second connection pads CP2 has dimensions which are greater than those of the other second connection pads, for example, a greater width. According to the present embodiment, two second connection pads CP2A which are located at one end and the other end of each of the lines are formed to have a width (for example, 1.2 to 2 times) greater than the width of the other second connection pads CP2 in the same line. The other second connection pads CP2 are formed to have the same dimensions. The second connection pads CP2 are connected to the corresponding first connection pads CP1 via the lines L of the FPC 62, respectively.

The second connection portion 64b comprises one or more positioning holes 66b for positioning. In the present embodiment, the second connection portion 64b comprises two positioning holes 66b formed at both end portions in a width direction.

As shown in FIG. 6 and FIG. 7, a through-hole 74 in the form of a slit is provided at a predetermined position on the bottom wall 12a. The through-hole 74, for example, has the sectional shape of a long narrow rectangle, and is formed to have a length which is slightly greater than the width of the FPC 62 and a width which is slightly greater than the thickness of the FPC 62. The through-hole 74 is formed to penetrate the bottom wall 12a, and opens at the inner surface and the outer surface of the bottom wall 12a.

The bottom wall 12a comprises a pair of bosses (positioning pins) 78a projected from the inner surface of the bottom wall in the vicinity of the through-hole 74. In addition, the bottom wall 12a comprises a pair of bosses (positioning pins) 78b projected from the outer surface of the bottom wall in the vicinity of the through-hole 74. The bosses 78a and 78b are, for example, formed into a cylindrical shape. The bosses 78a and 78b may be formed integrally with the bottom wall 12a, or may be composed of separate pins fixed on the bottom wall 12a.

The FPC 62 is inserted in the through-hole 74, and the relay portion 64c of the FPC 62 is located in the through-hole 74. The first connection portion 64a is bent to the inner surface side of the bottom wall 12a with respect to the relay portion 64c, and is located to face the inner surface of the bottom wall 12a. In addition, the bosses 78a are fitted in the pair of positioning holes 66a of the first connection portion 64a, respectively. The first connection portion 64a is thereby positioned and held on the inner surface of the bottom wall 12a in a state in which the first connection pads CP1 face the inside of the housing 10.

The second connection portion 64b is bent to the outer surface side of the bottom wall 12a with respect to the relay portion 64c, and is located to face the outer surface of the bottom wall 12a. In addition, the bosses 78b are fitted in the pair of positioning holes 66b of the second connection portion 64b. The second connection portion 64b is thereby positioned and held on the outer surface of the bottom wall 12a in a state in which the second connection pads CP2 face the outside of the housing 10. In the present embodiment, the second connection portion 64b is bent in the same direction as the first connection portion 64a. The second connection portion 64b thereby faces the first connection portion 64a with the bottom wall 12a interposed therebetween.

As shown in FIG. 8, a gap between the through-hole 74 of the bottom wall 12a and the relay portion 64c of the FPC 62 is filled with a sealant 65. The sealant 65 fills the gap between the through-hole 74 and the relay portion 64c, thereby preventing a leak of gas from the through-hole 74 and fixing the relay portion 64c on the bottom wall 12a.

As shown in FIG. 7 and FIG. 8, the second connector 70b is, for example, formed as a compression connector. The second connector 70b comprises a base 80 which is formed of an insulating material and is substantially in the form of a rectangular parallelepiped, and a plurality of conductive connection terminals CT2 which are fixed on the base 80. The connection terminals CT2 are formed by bending an elastic metallic plate into a predetermined shape. The connection terminals CT2 are arranged in a longitudinal direction of the base 80, for example, in two lines. In each of the lines, a plurality of connection terminals CT2, for example, six connection terminals CT2, are arranged with a gap therebetween. In addition, the two lines extend parallel to each other with a gap therebetween. The number of connection terminals CT2, the pitch of arrangement, and the position where they are disposed are set in accordance with the above-described second connection pads CP2 of the FPC 62.

End portions of the connection terminals CT2 project from the base 80, are soldered at predetermined positions on the control circuit board 54, and are mechanically and electrically connected to the control circuit board 54. The other end portions of the connection terminals CT2 project from the base 80 in a direction opposite to the control circuit board 54, that is, to the housing 10 side. The other end portions are bent to the base 80 side at intermediate portions, and constitute contact makers which can elastically contact the connections pads of the FPC 62.

At least one connection terminal of the connection terminals CT2 are formed to have a width or a diameter which is greater than that of the other connection terminals CT2. According to the present embodiment, two connection terminals CT2A which are located at one end and the other end of each of the lines are formed to have a width (for example, 1.2 to 2 times) greater than that of the other connection terminals CT2 in the same line. The other connection terminals CT2 are formed to have the same dimensions. The connection terminals CT2A, which are wide, are provided to correspond to the second connection pads CP2A, which are wide, respectively.

As shown in FIG. 8, the control circuit board 54 is disposed to face the outer surface of the bottom wall 12*a* and screwed on the bottom wall 12*a*, and the connection terminals CT2 of the second connector 70*b* are thereby pressed on the corresponding second connection pads CP2, respectively. The connection terminals CT2 in an elastically deformed state are thereby pressed on the second connection pads CP2, and are electrically connected to the second connection pads CP2.

As shown in FIG. 8, the first connector 70*a* has the same structure as that of the second connector 70*b*. That is, the first connector 70*a* comprises a base 81 which is formed as a compression connector and which is formed of an insulating material and is substantially in the form of a rectangular parallelepiped, and a plurality of conductive connection terminals CT1 which are fixed on the base 81. The connection terminals CT1 are formed by bending an elastic metallic plate into a predetermined shape. The connection terminals CT1 are arranged in a longitudinal direction of the base 81, for example, in two lines. In each of the lines, a plurality of connection terminals CT1, for example, six connection terminals CT1, are arranged with a gap therebetween. In addition, the two lines extend parallel to each other with a gap therebetween. The number of connection terminals CT1, the pitch of arrangement, and the position where they are disposed are set in accordance with the above-described first connection pads CP1 of the FPC 62.

End portions of the connection terminals CT1 project from the base 81, are soldered at predetermined positions on the FPC constituting the board unit 21, and are mechanically and electrically connected to the board unit 21. The other end portions of the connection terminals CT1 project from the base 81 in a direction opposite to the board unit 21, that is, to the bottom wall 12*a* side. The other end portions are bent to the base 81 side at intermediate portions, and constitute contact makers which can elastically contact the first connections pads CP1 of the FPC 62.

At least one connection terminal of the connection terminals CT1 are formed to have a width or a diameter which is greater than that of the other connection terminals CT1. According to the present embodiment, two connection terminals CT1A which are located at one end and the other end of each of the lines are formed to have a width (for example, 1.2 to 2 times) greater than that of the other connection terminals CT1 in the same line. The other connection terminals CT1 are formed to have the same dimensions. The connection terminals CT1A, which are wide, are provided to correspond to the first connection pads CP1A, which are wide, respectively.

As shown in FIG. 3 and FIG. 8, the first connector 70*a* is disposed to face the first connection portion 64*a* and the board unit 21 is screwed on the inner surface of the bottom wall 12*a*, and the connection terminals CT1 of the first connector 70*a* are thereby pressed on the corresponding first connection pads CP1, respectively. The connection terminals CT1 in an elastically deformed state are thereby pressed on the first connection pads CP1, and are electrically connected to the first connection pads CP1.

By means of the connection mechanism 60 having the above-described structure, the board unit 21 (first electrical component) disposed inside the housing 10 is electrically connected to the control circuit board 54 (second electrical component) disposed outside the housing 10 in a state in which the inside of the housing 10 is kept airtight.

According to the first embodiment having the above-described structure, by means of the connection mechanism 60 having a simple and low-priced structure comprising the FPC in the form of a sheet and the first and second connectors, an electrical component disposed inside the housing 10 and an electrical component disposed outside the housing 10 can be electrically connected to each other in a state in which the inside of the housing 10 is kept airtight. In addition, since at least one of the connection pads of the FPC 62 is a wide connection pad, the connection terminals CT1 of the first connector 70*a* can be brought into contact with the first connection pads CP1, even if the first connector 70*a* is disposed at a position shifted from a predetermined position with respect to the first connection portion 64*a*.

Figure 9A:
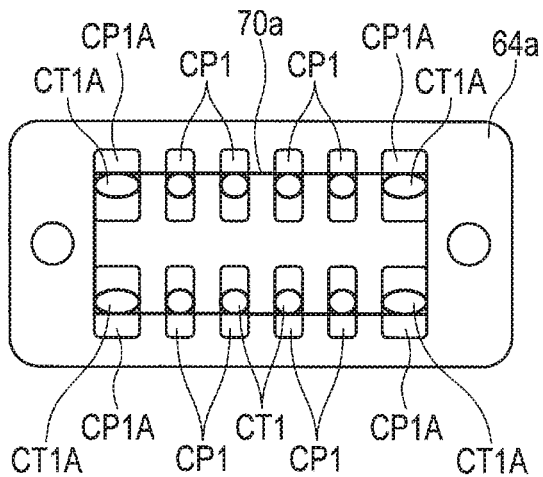
FIG. 9A is a plan view schematically showing a connection state of a connection portion of the flexible printed circuit and a connector disposed at a predetermined position.
Figure 9B:
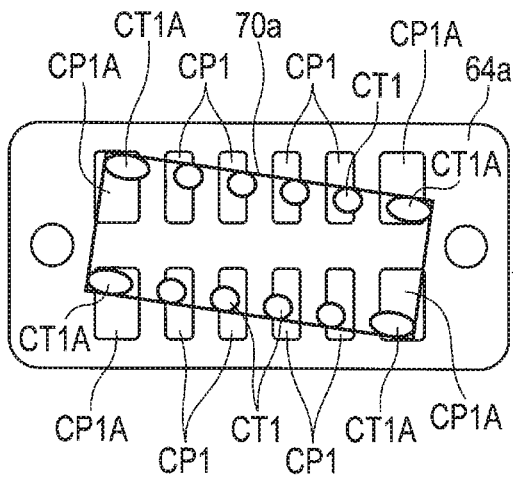
FIG. 9B is a plan view schematically showing a connection state of the connection portion of the flexible printed circuit and a connector disposed at a position shifted from the predetermined position.

FIG. 9A shows a connection state in a case where the first connector 70*a* is disposed at a predetermined position. FIG. 9B shows a connection state in a case where the first connector 70*a* is disposed at a position shifted from the predetermined position. From these figures, it can be seen that the connection terminals CT1 of the first connector 70*a* are surely connected to the first connection pads CP1, respectively, in both the case where the first connector 70*a* is disposed at the predetermined position and the case where the first connector 70*a* is disposed at the position shifted from the predetermined position. In this manner, the first connector 70*a* can be connected to the first connection portion 64*a* surely and stably, and an improvement in reliability can be made. Moreover, according to the present embodiment, the connection terminals CT1A of the first connector 70*a*, which correspond to the wide first connection pads CP1A, are formed to have a width or a diameter which is greater than that of the other connection terminals CT1. Thus, the connection terminals of the first connector 70*a* can be connected to the first connection pads CP1 and CP1A more surely and stably.

The same is true of the connection between the second connection portion 64*b* of the FPC 62 and the second connector 70*b*. Thus, the connection terminals CT2 of the second connector 70*b* can be connected to the second connection pads CP2 of the second connection portion 64*b* surely and stably, and the reliability of connection can be improved.

In addition, if the wide first connection pads CP1A or the wide second connection pads CP2A are used as connection pads for supplying power or connection pads for grounding, greater current can be passed thereto than to the other connection pads.

In view of the foregoing, according to the first embodiment, the electronic device, wherein electrical components can be connected more stably by virtue of a cheap structure, can be provided.

Various modified examples will be next described. In the modified examples described hereinafter, the same portions as those of the above-described first embodiment will be given the same reference numerals, and their detailed description is simplified or omitted. Portions different from those of the first embodiment will be mainly described in detail.

First Modified Example

FIG. 10 is a development view showing the flexible printed circuit (FPC) according to a first modified example. According to the first modified example, in the FPC 62, semicircular cutouts 66C formed at side edges of the FPC 62, respectively, are used as engagement portions which engage with the bosses of the housing.

If the cutouts 66c are used as the engagement portions, the first connection portion 64a and the second connection portion 64b of the FPC 62 can be easily engaged with the bosses of the bottom wall, and the first connection portion 64a and the second connection portion 64b can be positioned by the bosses.

Second Modified Example

FIG. 11 is a development view showing the flexible printed circuit (FPC) according to a second modified example. According to the second modified example, the FPC 62 comprises the positioning holes 66a formed at both the end portions of the first connection portion 64a, respectively, the positioning holes 66b formed at both the end portions of the second connection portion 64b, respectively, four second holes 66d formed at positions adjacent to the positioning holes 66a and 66b, respectively, and slits 71 which are formed between the positioning holes and the second holes 66d and which communicate with the second holes 66d.

According to the FPC 62 having the above structure, for example, if stress acts on the circumferences of the positioning holes 66a and 66b when the bosses are fitted in the positioning holes 66a and 66b, this stress can escape to the second holes 66d through the slits 71. A deformation, a break, etc., in the FPC 62 due to stress thereby can be prevented.

Third Modified Example

Figure 12:
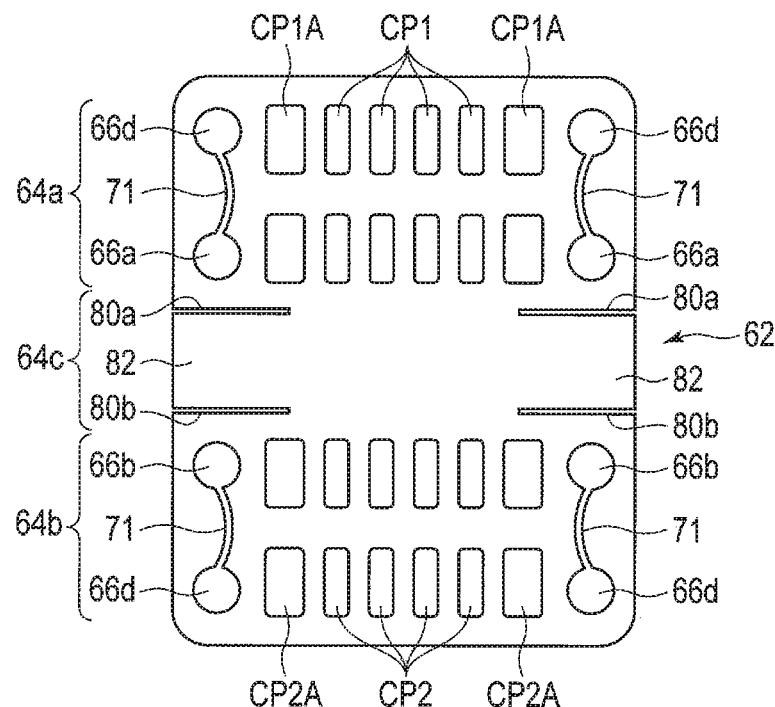
FIG. 12 is a development view of the flexible printed circuit according to a third modified example.
Figure 13:
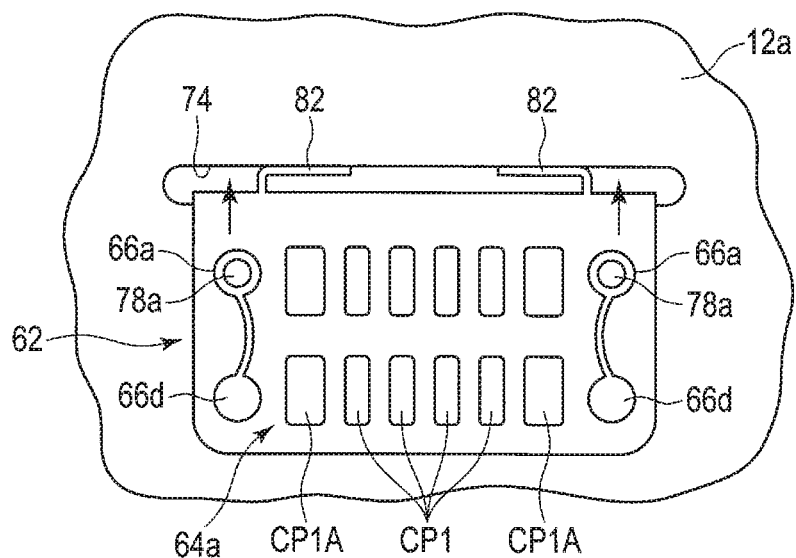
FIG. 13 is a plan view showing the flexible printed circuit and a part of the housing according to the third modified example.

FIG. 12 is a development view showing the flexible printed circuit (FPC) according to the third modified example. FIG. 13 is a plan view showing a state in which the FPC according to the third modified example is disposed in the housing.

According to the third modified example, as shown in FIG. 12, the FPC 62 comprises the positioning holes 66a and 66b, the second holes 66d, and the slits 71 as in the case of the above-described second modified example. Moreover, the FPC 62 comprises a pair of first slits 80a formed along a boundary between the first connection portion 64a and the relay portion 64c, and a pair of second slits 80b formed along a boundary between the second connection portion 64b and the relay portion 64c. The first slits 80a and the second slits 80b open at the side edges of the FPC 62, respectively. Since the first slits 80a and the second slits 80b are provided, both end portions in a width direction of the relay portion 64c constitute bendable tongue portions 82, respectively.

As shown in FIG. 13, when the FPC 62 having the above-described structure is attached to the bottom wall 12a of the housing, the relay portion 64c and the tongue portions 82 are inserted in the through-hole 74 of the bottom wall 12a in a state in which the pair of tongue portions 82 are bent to face a central portion in the width direction of the relay portion 64c. The pair of tongue portions 82 in an elastically deformed state press on the inner surface of the through-hole 74, and cause the relay portion 64c to press on the inner surface of the through-hole 74 on the opposite side. The relay portion 64c thereby can be positioned and held at a predetermined position in the through-hole 74.

Fourth Modified Example

Figure 14:
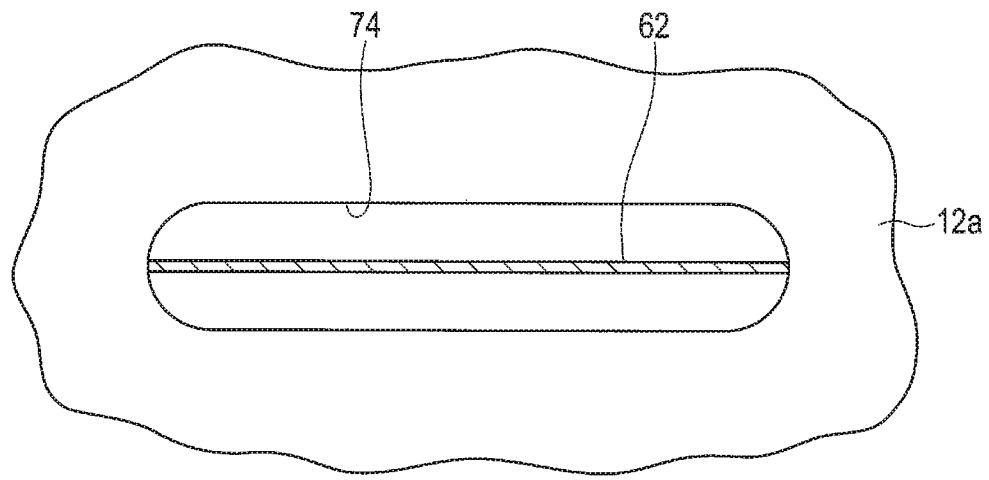
FIG. 14 is a plan view showing a slit in the housing according to a fourth modified example.

FIG. 14 is a plan view showing the through-hole of the housing according to a fourth modified example. As shown in this figure, according to the fourth modified example, the through-hole 74 is formed into the shape of a long narrow slit, and moreover, both end portions in a longitudinal direction of the through-hole 74 are formed into an arc shape. The through-hole 74 is formed, such that the length between the apex of one edge of the arc shape and the apex of the other edge of the arc shape is substantially equal to the width of the FPC 62. When the FPC 62 is inserted in the above through-hole 74, the FPC 62 is positioned at a position where both the side edges of the FPC 62 contact the apexes of the edges of the through-hole 74, respectively.

Fifth Modified Example

Figure 15:
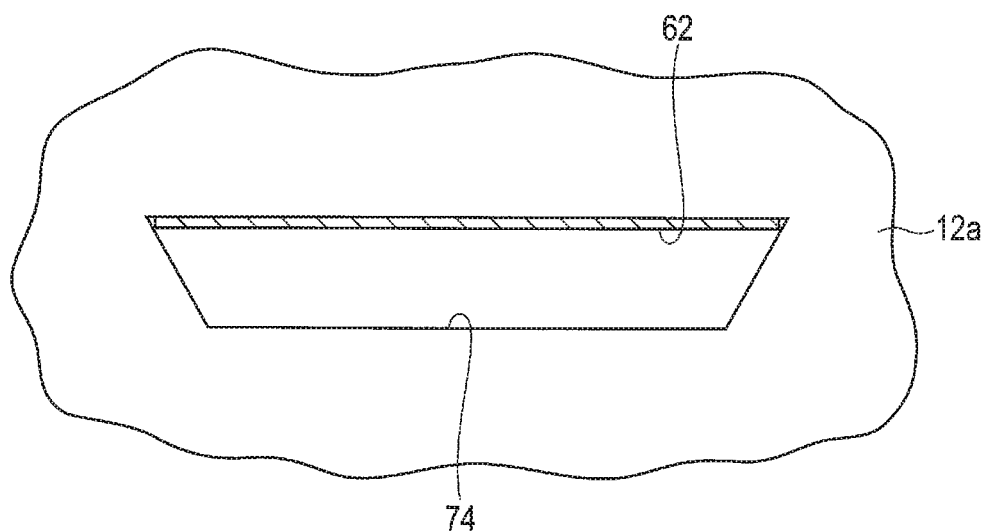
FIG. 15 is a plan view showing the slit in the housing according to a fifth modified example.

FIG. 15 is a plan view showing the through-hole of the housing according to a fifth modified example. As shown in this figure, according to the fifth modified example, the through-hole 74 is formed into the shape of a long narrow slit, and has the sectional shape of a trapezoid. The through-hole 74 is formed, such that the length of a portion as the base of the trapezoid is substantially equal to the width of the FPC 62. When the FPC 62 is inserted in the above through-hole 74, the FPC 62 is positioned at a position on the base side of the trapezoid in the through-hole 74.

Sixth Modified Example

Figure 16A:
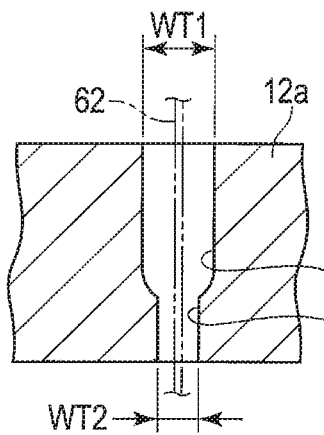
FIG. 16A is a cross sectional view showing a slit in the housing according to a sixth modified example.
Figure 16B:
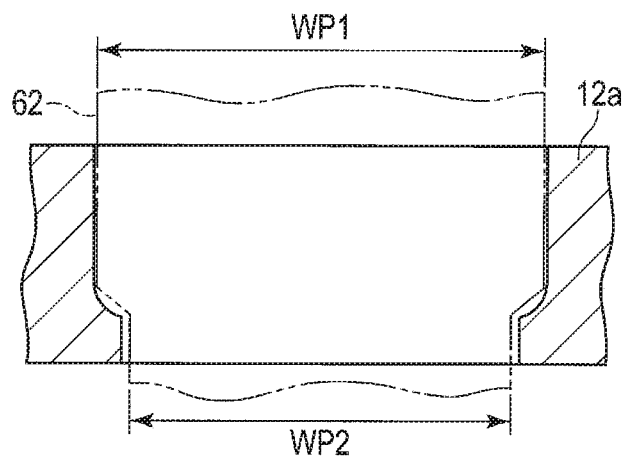
FIG. 16B is a longitudinal sectional view showing the slit in the housing according to the sixth modified example.
Figure 16C:
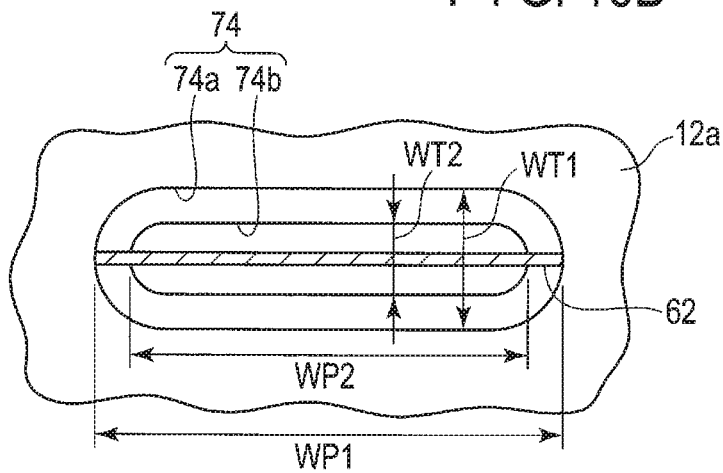
FIG. 16C is a plane view showing the slit in the housing according to the sixth modified example.

FIG. 16A, FIG. 16B, and FIG. 16C are sectional and plan views showing the through-hole of the housing according to a sixth modified example. As shown in these figures, according to the sixth modified example, the through-hole 74 formed to penetrate the bottom wall 12a is a stepped through-hole comprising a major diameter hole 74a and a minor diameter hole 74b. The major diameter hole 74a extends from the inner surface of the bottom wall 12a to the vicinity of the bottom wall 12a. The minor diameter hole 74b extends from the outer surface of the bottom wall 12a to the major diameter hole 74a, and communicates with the major diameter hole 74a. An end portion of the major diameter hole 74a which communicates with the minor diameter hole 74b is formed into a pointed or tapered shape.

The sectional shape of the major diameter hole 74a is formed into a slit shape having a first width WT1. Moreover, both ends in a longitudinal direction of the major diameter hole 74a are formed into an arc shape. The major diameter hole 74a is formed, such that the length between the apex of one edge of the arc shape and the apex of the other edge of the arc shape is substantially equal to a first width WP1 of the FPC 62.

The sectional shape of the minor diameter hole 74b is formed into a slit shape having a second width WT2 less than the above first width WT1. Moreover, both ends in a longitudinal direction of the minor diameter hole 74b are formed into an arc shape. The minor diameter hole 74b is formed, such that the length between the apex of one edge of the arc shape and the apex of the other edge of the arc shape is substantially equal to a second width WP2 of the FPC 62.

As is schematically shown in FIG. 16B, the FPC 62 is formed to have the first width WP1 from an intermediate portion of the relay portion to one end of the FPC 62, and have the second width WP2 from the intermediate portion of the relay portion to the other end of the FPC 62. The second width WP2 is less than the first width WP1.

As shown in FIG. 16A, FIG. 16B, and FIG. 16C, the FPC 62 is inserted in the through-hole 74, a portion having the first width is positioned at a position where both the side edges contact the apexes of the edges of the major diameter hole 74a, and a portion having the second width is positioned at a position where both the side edges contact the apexes of the edges of the minor diameter hole 74b. In this manner, since the through-hole 74 having the above shape is provided, the FPC 62 can be positioned at a predetermined position in the through-hole 74, and a displacement, a flexure, etc., of the FPC 62 can be prevented.

Seventh Modified Example

Figure 17:
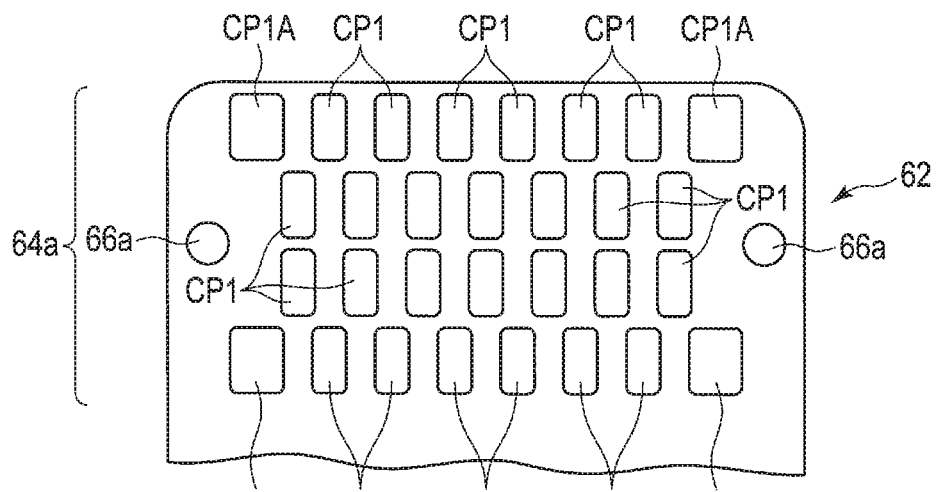
FIG. 17 is a plan view showing the connection portion of the flexible printed circuit according to a seventh modified example.

FIG. 17 is a plan view showing the connection portions of the flexible printed circuit (FPC) according to the seventh modified example. The structure of the first connection portion 64a will be described as a representative of the connection portions of the FPC. As shown in this figure, according to the seventh modified example, the first connection pads CP1 provided on the first connection portion 64a of the FPC 62 are arranged in a so-called zigzag pattern.

To be specific, the first connection pads CP1 are, for example, arranged in four lines. Each of the first connection pads CP1 is, for example, formed into a rectangular shape. Each of the lines extends in a direction orthogonal to the longitudinal direction of the FPC 62, for example, in the width direction. In each of the lines, the plurality of first connection pads CP1, for example, eight or seven first connection pads CP1, are arranged with a gap therebetween. The four lines extend parallel to each other with a gap therebetween in the longitudinal direction of the FPC 62.

When the above four lines are regarded as a first line, a second line, a third line, and a fourth line from one end side of the first connection portion 64a, the eight first connection pads CP1 constituting the first line are disposed at positions shifted in the width direction of the FPC 62, respectively, with respect to the seven first connection pads CP1 constituting the second line. In addition, the seven first connection pads CP1 constituting the third line are disposed at positions shifted in the width direction of the FPC 62, respectively, with respect to the eight first connection pads CP1 constituting the fourth line.

In the present modified example, the two first connection pads CP1A located at one end and the other end of the first line, and the two first connection pads CP1A located at one end and the other end of the fourth line have a width greater than that of the other first connection pads CP1 constituting each of the lines. That is, the surface area (contact area) of the first connection pads CP1A is greater than that of the other first connection pads CP1. Further, the second connection portions of the FPC 62 also have the same structure as that of the above-described first connection portion 64a.

As described above, according to the seventh modified example, the FPC, in which the connection pads are arranged in a zigzag pattern, can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. Various aspects of the invention can also be extracted from any appropriate combination of constituent elements disclosed in the embodiment. For example, some of the constituent elements disclosed in the embodiment may be deleted. Furthermore, the constituent elements described in different embodiments may be arbitrarily combined. The accompanying claims and their equivalents are intended to cover such forms or modifications as would fall within the scope and spirit of the inventions.

For example, the first connector and the second connector are not limited to compression connectors, and other connectors can be adopted. The first connection portion and the second connection portion of the FPC are not necessarily bent in the same direction, and may be bent in directions opposite to each other. The number of disposed connection pads and the shape of the connection pads are not limited to those in the above-described embodiment, and can be changed in various ways. In addition, the electronic device according to the present invention is not limited to a disk drive, and can be applied to other electronic devices.

What is claimed is:

1. An electronic device comprising:
 a housing comprising a through-hole;
 a flexible printed circuit comprising a first connection portion provided with a plurality of first connection pads and a second connection portion provided with a plurality of second connection pads, the flexible printed circuit being inserted in the through-hole, the first connection portion being disposed on an inner side of the housing, and the second connection portion being disposed on an outer side of the housing;
 a sealant filled in the through-hole to seal the through-hole and preventing a leak of gas from the through-hole;
 a first electrical component in the housing; and
 a first connector in the housing connected to the first electrical component, the first connector comprising a plurality of connection terminals which contact the first connection pads, respectively, wherein
 a first pad of the first connection pads is greater in size than other first connection pads.

2. The electronic device of claim 1, wherein
 a connection terminal of the first connection terminals, which contacts the first pad, includes a greater width or a greater diameter than a width or a diameter of other first connection terminals.

3. The electronic device of claim 2, further comprising: a second electrical component provided outside the housing; and
 a second connector connected to the second electrical component,
 wherein the second connector comprises a plurality of connection terminals which contact the second connection pads, respectively, and
 a second pad of the second connection pads is greater in size than other second connection pads.

4. The electronic device of claim 3, wherein
 a connection terminal of the connection terminals, which contacts the second pad of the second connection pads, includes a greater width or a greater diameter than a width or diameter of other connection terminals.

5. The electronic device of claim 2, further comprising: a disk-shaped recording medium in the housing; and a head which records data on the recording medium, and
the gas has a lower density than a density of air and the gas is sealed in the housing.

6. The electronic device of claim 1, wherein
the first pad of the first connection pads is a connection pad for supplying power or for grounding.

7. The electronic device of claim 1, wherein
the first connection pads are arranged in a plurality of lines, and
the first pad of the first connection pads is located at one end or the other end of each of the lines.

8. The electronic device of claim 1, wherein
the housing comprises a pair of projections, and
the first connection portion comprises engagement portions fitted to the projections.

9. The electronic device of claim 1, further comprising: a second electrical component provided outside the housing; and
a second connector connected to the second electrical component,
wherein the second connector comprises a plurality of connection terminals which contact the second connection pads, respectively, and
a second pad of the second connection pads is greater in size than other second connection pads.

10. The electronic device of claim 9, wherein
a connection terminal of the connection terminals, which contacts the second pad of the second connection pads, includes a greater width or a greater diameter than a width or diameter of other connection terminals.

11. The electronic device of claim 9, wherein
the second connection pads comprise a plurality of the second pads.

12. The electronic device of claim 1, further comprising: a disk-shaped recording medium in the housing; and a head which records data on the recording medium,
wherein the gas having a lower density than a density of air is sealed in the housing.

13. The electronic device of claim 1, wherein
the first connection pads comprise a plurality of the first pads.

14. The electronic device of claim 1, wherein
the first connector comprises a base, and the connection terminals project from the base toward the first connection portion and directly contact the first connection pads, respectively.

15. The electronic device of claim 1, wherein
the flexible printed circuit is formed into a flat band and into a film.

16. The electronic device of claim 1, wherein
the flexible printed circuit comprises a base insulating layer of an insulating synthetic resin, a conductive layer laid on the base insulating layer, and a cover insulating layer laid on the base insulating layer and the conductive layer.

* * * * *